United States Patent [19]
Nakanishi et al.

[11] Patent Number: 4,989,252

[45] Date of Patent: Jan. 29, 1991

[54] SILENCER

[75] Inventors: Keiji Nakanishi, Takatsuki; Yasuyuki Sekiguchi, Ibaraki, both of Japan

[73] Assignee: Kabushiki Kaisha Toshiba, Kawasaki, Japan

[21] Appl. No.: 413,559

[22] Filed: Sep. 28, 1989

[30] Foreign Application Priority Data

Sep. 30, 1988 [JP] Japan ................................ 63-248467

[51] Int. Cl.[5] ............................................ H03B 29/00

[52] U.S. Cl. ....................................................... 381/71

[58] Field of Search .......................................... 381/71

[56] References Cited

U.S. PATENT DOCUMENTS 2,043,416 6/1936 Lueg .
4,506,380 3/1985 Matsai .................................. 381/71
4,527,282 7/1985 Chaplin et al. ........................ 381/71
4,805,733 2/1989 Kato et al. ............................ 381/71

FOREIGN PATENT DOCUMENTS 63-311396 12/1988 Japan .
2149614 6/1985 United Kingdom .

*Primary Examiner*—Forester W. Isen
*Attorney, Agent, or Firm*—Cushman, Darby & Cushman

[57] ABSTRACT

A silencer for refrigerators includes a microphone receiving sound from a motor-compressor mounted in a machine compartment to thereby generate an electrical signal in accordance with the received sound, a signal converter converting the electrical signal generated by the noise receiver to an electrical signal for producing sound deadening the sound from the motor-compressor by the effect of sound wave interference, and a speaker for producing the sound based on the signal converted by the signal converter so that the sound interferes with the sound from the motor-compressor. The machine compartment is closed with a ventilating opening left opened. One of dimensions of the machine compartment in the three-dimensional directions is set at a value larger than those of the others so that a standing wave of the sound from the motor-compressor in the machine compartment is composed only in a primary mode in a low frequency range below 700 Hz. The ventilating opening is formed into a generally rectangular shape extending in the direction perpendicular to the direction that the standing wave travels.

22 Claims, 7 Drawing Sheets

SILENCER

BACKGROUND OF THE INVENTION

The present invention generally relates to a silencer for deadening sound produced from a noise source by the effect of sound wave interference, and more particularly to such a silencer suitable for the case where the noise source is enclosed in a compartment.

Almost every home is generally furnished with a refrigeration system such as a refrigerator, which is in continuous operation throughout the year. Such a household refrigerator can be noisy. In the refrigerator, one critical noise source is a machine compartment enclosing a compressor and piping system connected to the compressor. More specifically, from the machine compartment emanates a relatively loud noise, for example, noise produced from driving a compressor motor, noise produced from the flow of the compressed gas, and mechanical noise produced by movable members of a compression mechanism. Further, the piping system connected to the compressor produces noise due to vibration thereof. The noise emanating from the machine compartment thus accounts for a large part of the noise of the refrigerator. Accordingly, control of noise from the machine compartment contributes to noise reduction in the refrigerator.

Conventionally, compressors of the low noise type such as a rotary compressor have been employed for the purpose of reducing noise emanating from the machine compartment. Further, the construction of vibration-proofing of the compressor has been improved and the configuration of the piping has been improved, thereby providing damping of the vibration in a vibration transmission path. Further, noise absorptive and insulative members have been disposed around the compressor and piping system, thereby improving an amount of noise absorbed in the machine compartment and a noise transmission loss.

However, a plurality of ventilating openings are formed in one or more walls defining the machine compartment for ventilating the machine compartment, and the noise produced in the machine compartment leaks outward through the ventilating openings. As the result of the provision of the ventilating openings, the above-mentioned conventional noise-reduction methods each have a definite limit and provide at most noise reduction of 2 dB.

With the advancement of applied electronic techniques including sound data processing circuitry and acoustic control techniques, application of a system wherein noise is deadened by the effect of sound wave interference has recently been taken into consideration. More specifically, in the above-mentioned noise control, sound generated by a noise source is received by a sound receiver such as a microphone disposed in a specific position and the sound receiver generates an electrical signal in accordance with the received sound. The electrical signal is then converted to a control signal by signal converting means. The control signal is supplied to a speaker so that an artificial sound of opposite phase or 180° out of phase with the noise received by the microphone and having the same frequencies and amplitude as that of the received sound is produced by the speaker, so that the artificial sound interferes with the received sound, thereby deadening the sound. However, when such a noise control system is employed for reducing noise in the machine compartment of the refrigerator, there is a problem in that the noise control manner is complicated since the machine compartment is not completely sealed such that the noise produced in the machine compartment leaks in all directions. Accordingly, in the actual circumstances, the above-described noise control has not been put into practical use in a refrigerator.

SUMMARY OF THE INVENTION

Therefore, a primary object of the present invention is to provide a silencer for deadening sound emanated from the noise source by the effect of sound wave interference.

A second object of the invention is to provide a silencer suitable for provision in a compartment so constructed as to simplify means for applying the effect of sound wave interference.

A third object of the invention is to provide a silencer particularly suitable for reduction of noise produced from a motor-compressor having a refrigerating cycle.

In order to achieve these objects and others, the present invention provides a silencer including a sound receiver for receiving sound from a noise source in a compartment to thereby generate an electrical signal in accordance with the received sound, signal converting means for converting the electrical signal generated by the sound receiver to an electrical signal corresponding to sound interfering with the sound received by the sound receiver, and sound producing means for producing sound in accordance with the electrical signal generated by the signal converting means so that the sound from the noise source is deadened by the effect of sound wave interference and characterized in that the compartment is defined by side, bottom, ceiling, front and rear walls so that one of the dimensions of the compartment in the direction of the length, height and width thereof is set at a value larger than those of the others such that a standing wave of the sound to be silenced is composed only in said one direction, and that the sound receiver and sound producing means are disposed in the compartment.

It is preferable that the compartment has a ventilating opening formed in one of the walls thereof in a slender rectangular shape so that the ventilating opening longitudinally intersects the direction in which the standing wave of the sound travels in the compartment. The ventilating opening may be formed in one end side of one of the compartment walls extending longitudinally, the sound producing means being disposed at the ventilating opening side with the sound receiver disposed at the other end side of the compartment wall extending longitudinally.

The noise source may include a motor-compressor having a refrigerating cycle.

The invention may be applied to a refrigerator wherein a heat-insulative cabinet has a storage compartment therein and an evaporator provided therein so as to comprise a refrigerating cycle and wherein an outer casing is provided on the top of the heat-insulative cabinet so as to define a cavity therein, said outer casing enclosing a motor-compressor comprising the refrigerating cycle and is characterized by a silencer for deadening sound generated by the motor-compressor. The silencer comprises a compartment defined by a partitioning wall in the cavity so as to have side, upper, bottom, front and rear walls, a sound receiver disposed with the motor-compressor in the compartment so as to receive sound generated by the motor-compressor to thereby generate an electrical signal in accordance with the received sound, signal converting means to convert the electrical signal generated by the sound receiver to an electrical signal corresponding to the sound interfering with the sound received by the sound receiver, sound producing means provided in the compartment producing sound for deadening the sound from the motor-compressor by the effect of sound wave interference, and one of the dimensions of the compartment in the directions of the length, height and width thereof being set at a value larger than those of the others such that a standing wave of the sound to be deadened is composed only in said one direction.

A concept of noise control by the silencer of the present invention will be described with the invention applied to a refrigerator for deadening noise from a motor-compressor of a refrigerating cycle thereof. The inventors of the present invention measured levels of the noise produced by a generally constructed motor-compressor of a refrigerator. The inventors found that the level of the noise produced with drive of the compressor has a characteristic that the noise level is increased in the frequency bands below 700 Hz and between 1.5 and 5 kHz. The damping effect of the conventional sound absorbing members is high for the high frequency noise but low for the noise of low frequency band below 700 Hz. Accordingly, the low frequency noise is aimed at as a target frequency of the silencer of the present invention. In the case of the target frequency below 700 Hz, when two of the height, depth and width dimensions of a machine compartment enclosing the motor-compressor are so set as to be shorter than the wavelength of noise (50 cm under the sound velocity of 340 m/sec.) and the other dimension is so set as to be longer than the above-mentioned wavelength, a standing wave of the noise produced in the machine compartment is composed only in the direction of the longer dimension, not in the three-dimensional directions. More specifically, when one of lengths of the machine compartment in the three-dimensional directions, that is, height, depth and width is so set as to be larger than those of the others, the standing wave of the sound produced in the machine compartment may travel in the one direction in the frequency band below 700 Hz. In the case where the machine compartment is so constructed as described above, sound produced in the machine compartment may be considered a one-dimensional plane traveling wave, whereby the control for causing an artificial sound from the sound producing means to interfere with the noise may be performed easily and precisely. Since the ventilating opening which may be provided in the wall of the compartment is formed in a slender rectangular shape extending in the direction intersecting perpendicularly to the direction that the standing wave is composed, it is difficult for the harmonic component of the one-dimensional plane traveling wave to leak out of the machine compartment. Since the machine compartment is, of course, provided with the ventilating opening, the machine compartment interior temperature is not excessively increased owing to heat generated during drive of the compressor, thereby providing sufficient compensation for the compressor motor winding temperature.

In a case where an outer casing is integrally formed on the top of the refrigeration system body and the machine compartment is formed by partitioning the machine compartment space with one or more partition panels, the dimensions of the machine compartment may be set with ease so as to be suitable for the purpose of the noise control, thereby enhancing a degree of freedom in the design.

In a case where the ventilating opening is formed in the upper side of the machine compartment disposed on the top of the refrigeration system body, the ventilating efficiency may be improved, thereby restraining the increase of machine compartment interior temperature with high efficiency.

Other and further objects of the present invention will become obvious upon an understanding of the illustrative embodiment about to be described or will be indicated in the appended claims, and various advantages not referred to herein will occur to one skilled in the art upon employment of the invention in practice.

DESCRIPTION OF THE PREFERRED EMBODIMENT

First to third embodiments in each of which the present invention is applied to a refrigerator will now be described. The principle of deadening sound by the effect of sound wave interference employed in each embodiment will first be explained in brief.

Figure 15:
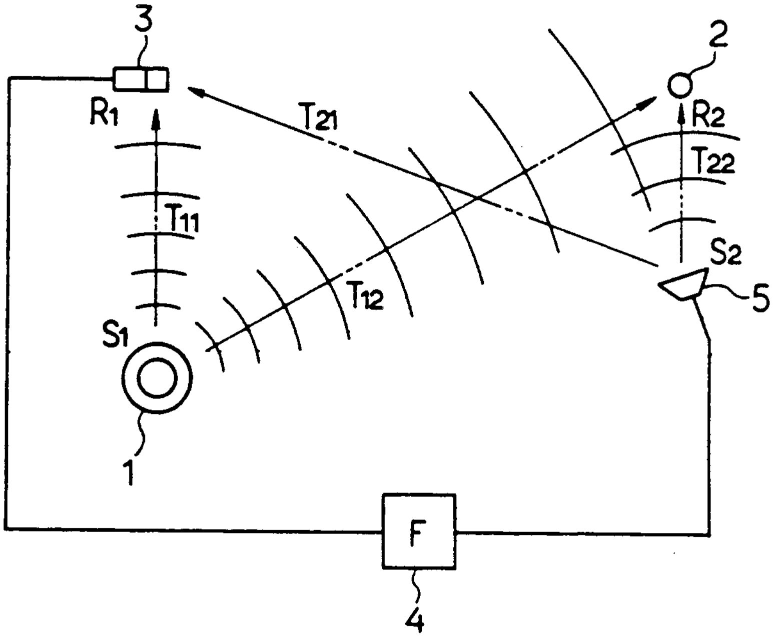
FIG. 15 is a schematic view illustrating the principle of deadening sound by the effect of sound wave interference.

Referring first to FIG. 15, reference numeral 1 designates a noise source such as a motor-compressor and reference numeral 2 a control point where an artificial sound is caused to interfere with the noise. The sound from the noise source 1 is received by a sound receiver 3 such as a microphone and the sound receiver 3 generates an electrical signal in accordance with the received sound. The electrical signal is converted to a control signal by signal converting means 4 including a filter or a microcomputer, and the control signal is supplied to a sound producing means 5 such as a speaker, thereby driving the sound producing means 5. The signal converting means 4 is assigned the function of converting the phase of an input sound signal as well known in the art of the noise silencing by the effect of sound wave interference, as disclosed in U.S. Pat. No. 2,043,416 to Paul Lueg and Japanese Laid-open Patent Application (Kokai) No. 63-311396.

More specifically, the following equation holds as for two-input and two-output system:

$$\begin{bmatrix} R1 \\ R2 \end{bmatrix} = \begin{bmatrix} T11 & T21 \\ T12 & T22 \end{bmatrix} \begin{bmatrix} S1 \\ S2 \end{bmatrix}$$

where

S1=sound produced by noise source 1

S2=sound produced from speaker 5

R1=sound received by sound receiver 3

R2=sound at control point 2

T11, T21, T12, T22=acoustic transmission functions between input and output points of the above sounds respectively Accordingly, sound S2 to be produced by speaker 5 is obtained by the following equation:

$$S2=(-T12\cdot R1+T11\cdot R2)/(T11\cdot T22-T12\cdot T21)$$

Since the goal is to reducing the acoustic level at control point 2 to zero, zero is substituted for R2 as follows:

$$S2=R1\cdot T12/(T12\cdot T21-T11\cdot T22)$$

As is understood from the equation, in order to render R2 zero, sound R1 received by microphone 12 may be processed by a filter expressed by the following equation:

$$F=T12/(T12\cdot T21-T11\cdot T22)$$

Thus, if a processed sound S2 thus obtained is produced from speaker 5, the sound level at control point 2 can be theoretically rendered zero.

Figure 1:
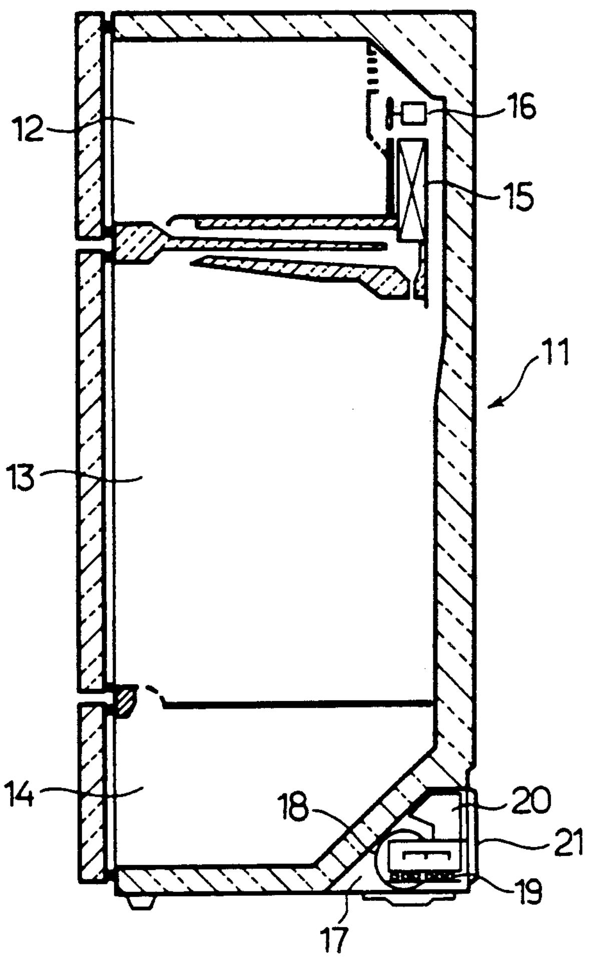
FIG. 1 is a longitudinal sectional view of a refrigerator to which a silencer of a first embodiment in accordance with the invention is applied.
Figure 2:
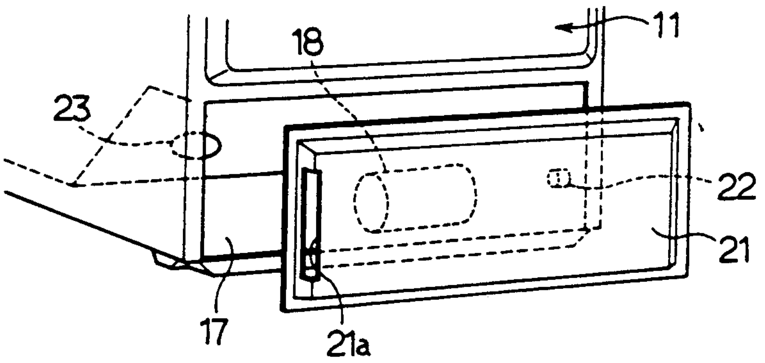
FIG. 2 is an exploded perspective view of the part of the refrigerator in FIG. 1 relating to the invention.
Figure 3:
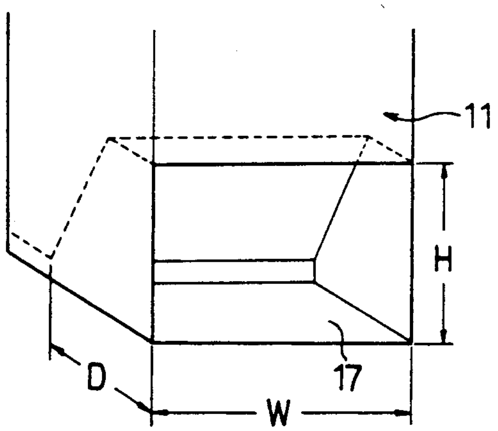
FIG. 3 is a schematic perspective view of the part in FIG. 2 relating to the invention for explanation of dimensional relationship.

FIGS. 1 to 3 illustrate a first embodiment of the invention which will now be described.

Referring first to FIG. 1 illustrating overall construction of the refrigerator, reference numeral 11 designates a heat-insulative cabinet of the refrigerator. The interior of refrigerator cabinet 11 is partitioned to a freezing compartment 12, a storage compartment 13 and a vegetable compartment 14. An evaporator 15 is provided at the backside of freezing compartment 12. A fan 16 is provided for directly supplying chilled air to freezing and storage compartments 12 and 13. A machine compartment 17 is provided at the lower backside of refrigerator cabinet 11. Machine compartment 17 encloses a motor-compressor 18 of the rotary type, a condenser pipe 19 and a defrost-water vaporizer 20 employing ceramic fins.

As shown in FIG. 2 wherein condenser pipe 19 and defrost-water vaporizer 20 are eliminated, machine compartment 17 has at the backside a rectangular opening which is closed by a machine compartment cover 21. In closing the opening of machine compartment 17, the periphery of cover 21 is air-tightly attached against the opening edge of machine compartment 17. A slenderly rectangular ventilating opening 21*a* extending vertically is formed in the left-hand edge portion of cover 21, as viewed in FIG. 1. Thus, when cover 21 is attached to machine compartment 17, the same is closed except ventilating opening 21*a*. Cover 21 is formed of a hard material having good heat-conductivity and large sound-transmission loss properties, such as a metal like steel.

A microphone 22 serving as a noise receiver is provided in machine compartment 17. Microphone 22 is disposed so as to be opposite the compressor 18 from the side opposite the ventilating opening 21*a* (the right-hand side, as viewed in FIG. 2). Microphone 22 generates an electrical signal in accordance with the sound received from the motor-compressor 18. A speaker 23 serving as sound producing means is provided in machine compartment 17. Speaker 23 is mounted in a portion of an inner wall of machine compartment 17 corresponding to the bottom wall of refrigerator cabinet 11, the portion being in the vicinity of ventilating opening 21*a*. An electrical signal generated by the microphone 22 is converted by a signal converting means 4 to an electrical signal corresponding to a desired sound to interfere with the sound from motor-compressor 18. The electrical signal generated by the signal converting means 4 is supplied to the speaker 23 to operate the same. The above-described electrical signal conversion or signal processing is based on the principle of deadening sound by the effect of sound wave interference as explained with reference to FIG. 15.

When the motor-compressor 18 is driven in the above-described refrigerator, the sound level in machine compartment 17 has a characteristic that the level is increased in the range below 700 Hz and in the ranges between 1.5 and 5 kHz, as described above. Of the sound of the respective ranges, the high frequency noise can be damped by way of transmission loss through cover 21 or the like and dissipated by providing a sound absorption member in machine compartment 17. Accordingly, the noise control by the above-described microphone 22, speaker 23 and signal converting means 4 is aimed at the sound of frequencies below 700 Hz.

In the case of the above-described noise control by way of the sound wave interference, it is important that the noise in machine compartment 17 be composed to be a one-dimensional plane traveling wave so that the noise control is performed theoretically and technically with ease and accuracy. In the embodiment, for example, the width W or transverse dimension of machine compartment 17 is determined so as to take a value larger than those of the depth D or front-to-back dimension and height H or longitudinal dimension thereof, as shown in FIG. 3. More definitely, the width W is determined to be 600 mm and each of the depth D and height H 200 mm. In other words, the dimension of width W is approximated to the wavelength of the sound to be deadened and the dimensions of depth and height are shorter than the wavelength of the sound to be deadened such that a standing wave of the sound in machine compartment 17 holds only for a primary mode. When machine compartment 17 is considered a rectangular cavity, the following equation holds:

$$f = C\cdot\sqrt{(Nx/Lx)^2+(Ny/Ly)^2+(Nz/Lz)^2}/2$$

where f=resonant frequency (Hz)

Nx, Ny and Nz=ordinal modes in the directions of X, Y and Z, respectively

Lx, Ly and Lz=dimensions in the directions of X, Y and Y in machine compartment 17, that is, D, W and H, respectively C=sound velocity From the above equation, frequencies fx, fy and fz of a first standing wave in the respective directions of X, Y and Z can be obtained.

More specifically, when the depth D is determined to be 200 mm with the width W and height H 600 mm and 200 mm, respectively, the frequency fx of the first standing wave of a fundamental wave in the direction of X can be obtained as:

$$fx = 340\sqrt{(1/0.2)^2}/2 = 850 \text{ Hz}$$

where

Ny=Nz=0

C=340 m/sec.

Similarly, frequencies fy and fz of the first standing wave of the fundamental wave in the respective directions of Y and Z can be obtained as:

$$fy = 340\sqrt{(1/0.6)^2}/2 = 283 \text{ Hz}$$

$$fz = 340\sqrt{(1/0.2)^2}/2 = 850 \text{ Hz}$$

Consequently, in the range below the target frequency (700 Hz), the standing wave of sound in machine compartment 17 holds in the mode of the direction of Y (direction of the width) and, therefore, the sound produced in machine compartment 17 may be considered a one-dimensional plane traveling wave. Consequently, the theoretical handling of the wave front can be rendered easy when sound is to be deadened by way of the sound wave interference in the use of speaker 23 and the like, and the silencing control can be performed with ease and accuracy. Since the ventilating opening 21*a* is formed in a generally slender rectangular shape extending in the direction perpendicular to the direction in which the standing wave travels (direction of the width W of machine compartment 17), it is difficult for the harmonic component of the one-dimensional plane traveling wave to leak out of machine compartment 17 through ventilating opening 21*a*, whereby the noise control may be ensured. Ventilating opening 21*a* does not need to longitudinally intersect completely perpendicularly to the direction that the standing wave travels. Since machine compartment 17 communicates to the outside through ventilating opening 21*a*, the machine compartment interior temperature is not excessively increased due to heat generated during drive of motor-compressor 18. Further, since the machine compartment cover 21 is formed of a high heat-transferable material, heat dissipation capacity for heat generated in machine compartment 17 is improved, thereby further restraining the increase of the machine compartment interior temperature. Additionally, since the material of machine compartment cover 21 also has a large sound transmission loss, the leakage of sound through the machine compartment cover 21 may be restrained.

Figure 4:
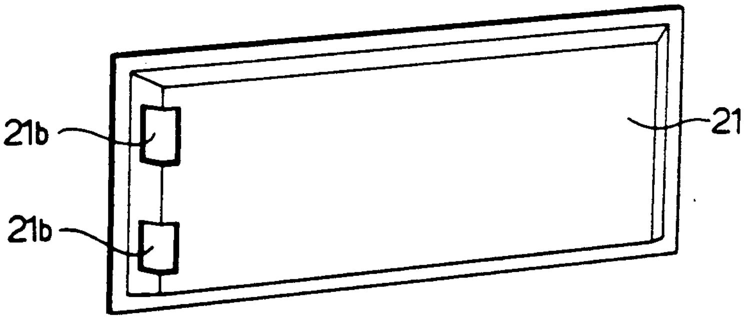
FIGS. 4 and 5 are perspective views of covers of the machine compartment showing modified forms of the first embodiment, respectively.
Figure 5:
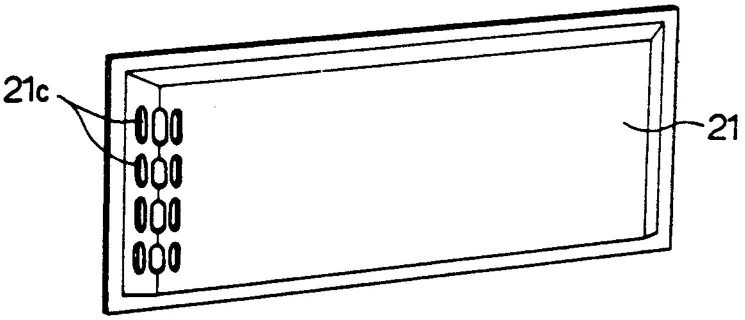

Although one slenderly rectangular ventilating opening 21*a* is formed in machine compartment cover 21 in the foregoing embodiment, two slenderly rectangular ventilating openings 21*b* may be formed in machine compartment cover 21, as is shown in FIG. 4. In such a case, it is preferable that each ventilating opening 21*b* be extended vertically and desirable that the distance between ventilating openings 21*b* take the value of 50 mm or above. Furthermore, a plurality of slender circular ventilating openings 21*c* may be formed in the machine compartment cover 21 so as to extend vertically.

Figure 6:
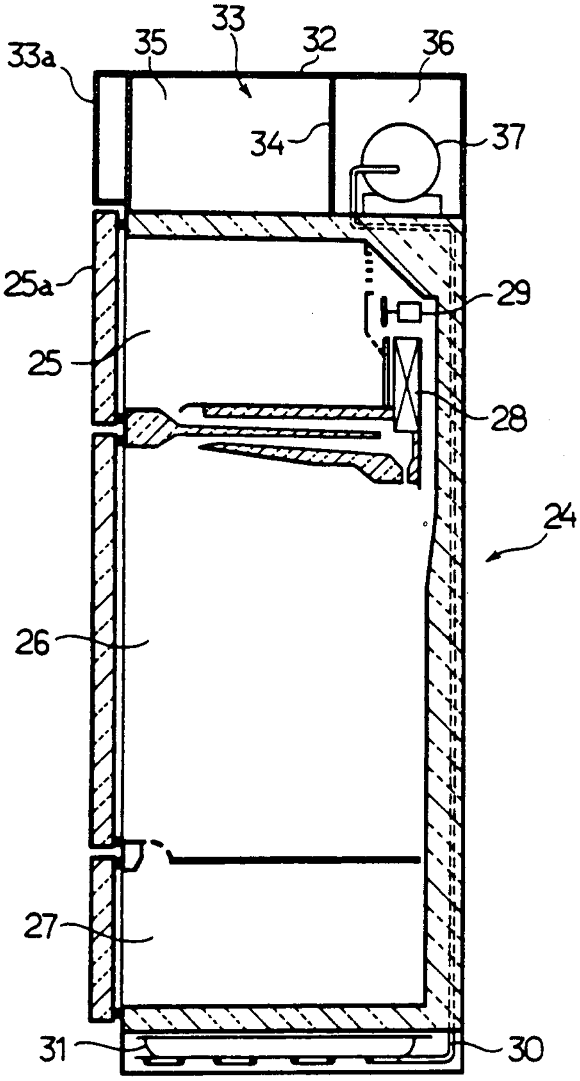
FIG. 6 is a view similar to FIG. 1 showing a refrigerator to which the silencer of a second embodiment is applied.
Figure 7:
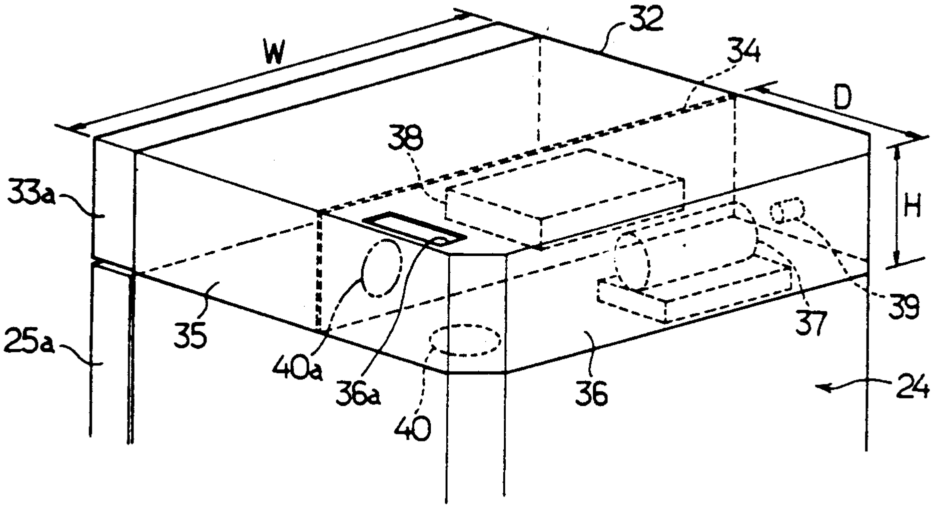
FIG. 7 is a perspective view of the part of the refrigerator in FIG. 6 relating to the invention.
Figure 8:
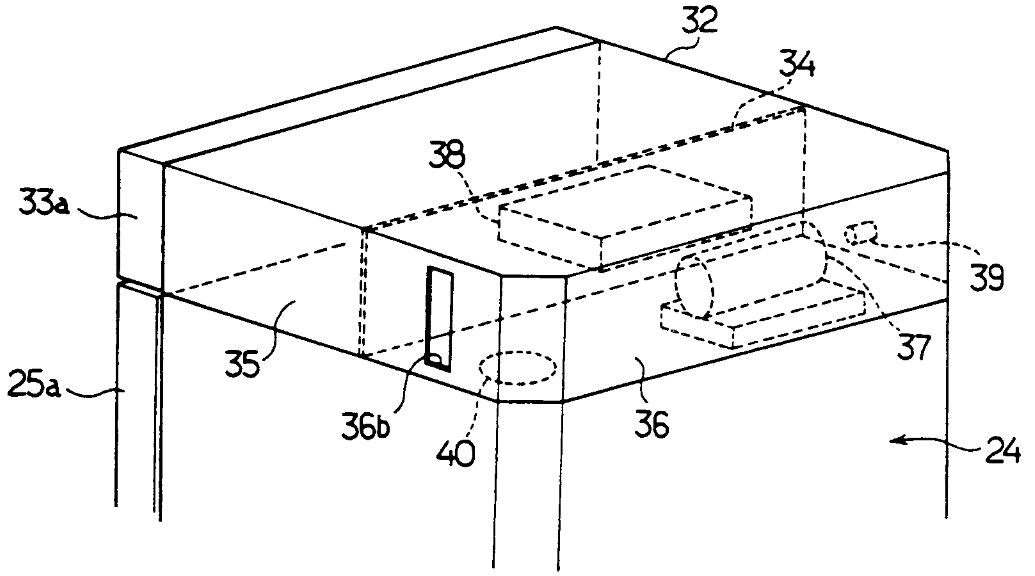
FIGS. 8 and 9 are views similar to FIG. 7 illustrating modified forms of the second embodiment respectively.

FIGS. 6 and 7 illustrate a second embodiment of the invention. In this embodiment, the invention is applied to a refrigerator in which the compressor is disposed on the top of the refrigerator cabinet.

Referring to FIG. 6, reference numeral 24 designates a refrigerator cabinet, in which a freezing compartment 25, storage compartment 26 and vegetable compartment 27 are provided. An evaporator 28 is provided at the backside of freezing compartment 25. A fan 29 is provided for supplying chilled air induced by evaporator 28 to freezing compartment 25 and storage compartment 26. A condenser pipe 30 extends from the backside of the refrigerator cabinet 24 to the bottom thereof. Condenser pipe 30 takes a serpentine path at the bottom of refrigerator cabinet 24, thereby comprising a heating section for defrost-water vaporization, on which heating section a vaporizing pan 31 is seated.

A generally rectangular container-shaped outer casing 32 is integrally formed on the top of refrigerator cabinet 24, thereby defining a machine compartment space 33. A decorative panel 33*a* is attached to the front side of machine compartment space 33 so as to be planar to a freezing compartment door 25*a*. Machine compartment space 33 is air-tightly partitioned by a partition panel 34 to a front part compartment 35 and a rear machine compartment 36 in which a motor-compressor 37 is provided.

Referring to FIG. 7, a generally slender rectangular ventilating opening 36*a* is formed in a portion of outer casing 32 corresponding to the upper wall of machine compartment 36 so as to extend in the direction perpendicular to the direction in which machine compartment 36 extends longitudinally in the vicinity of one of elongated edges thereof. Accordingly, machine compartment 36 is closed except for the ventilating opening 36*a*. As in the foregoing embodiment, the width W of machine compartment 36 is determined so as to take a value larger than those of the depth D and height H thereof. For example, the width W is determined to be 600 mm or above and both of the depth D and height H 200 mm such that a standing wave of the sound generated in machine compartment 36 holds only in a primary mode. Outer casing 32 and partition panel 34 comprising the peripheral walls of machine compartment 36 are formed of a material having good heat transfer properties and large sound transmission loss, for example, a metal such as steel. Electrical parts assembly 38 comprising a refrigerator control circuit is provided on the bottom of parts compartment 35.

A microphone 39 serving as a sound receiver is disposed in machine compartment 36. Microphone 39 is disposed so as to be opposite a motor-compressor 37 from the side opposite the ventilating aperture 36*a* (the right-hand side, as viewed in FIG. 6). Sound produced from the compressor 37 as a noise source is converted to a corresponding electrical signal by the microphone 39. A speaker 40 serving as a sound producing means is disposed in the machine compartment 36. Speaker 40 is embedded in a portion of a bottom wall of the machine compartment 36 corresponding to the top wall of the refrigerator cabinet 24, the portion being in the vicinity of the ventilating opening 36a. Speaker 40 is operated in response to a control signal obtained by processing the electrical signal from microphone 39, based on the above-described noise control principle as in the foregoing embodiment.

According to the above-described embodiment, the same effect may be achieved as in the foregoing embodiment. Since ventilating opening 36a is formed into a generally slender rectangular shape extending in the direction intersecting perpendicularly to the direction that the standing wave of the sound generated in machine compartment 36 is composed, noise control may be ensured as in the foregoing embodiment. Additionally, the following several effects may be achieved from the embodiment: since machine compartment 36 is formed by partitioning machine compartment space 34 by partition panel 34, the dimensions of machine compartment 36 may be determined with ease, and a degree of freedom in design may be improved Since machine compartment 36 is positioned so as not to be affected by the defrost water to be vaporized in vaporizing pan 31, microphone 39 and speaker 40 may be prevented from being affected by humidity, thereby assuring reliability thereof. Since the portion of machine compartment space 33 other than machine compartment 36 is utilized as parts compartment 35, the dead space resulting from the specific configuration of the machine compartment 36 may be effectively used. Further, since part compartment 35 is positioned in front of the machine compartment 36, electrical parts assembly 38 may be repaired with ease. Since the ventilating opening 36a is formed in the upper side of the machine compartment 36, the ventilating effect by way of the opening 36a may be improved.

Although speaker 40 is mounted on the bottom wall of the machine compartment 36 in the foregoing embodiment, speaker 40a may be mounted on the partition panel 34 as is shown by the alternate long and two short dashes line in FIG. 6, with the result that the mounting of the speaker 40a may be simplified as compared with in the case of embedding the speaker. In such a mounting manner, the rear side of speaker 40a is surrounded by outer casing 32 formed from a material having a large sound transmission loss and accordingly, unnecessary sound transmitted from the rear side of speaker 40a may be intercepted by outer casing 32, thereby preventing the generation of unnecessary noise.

Figure 9:
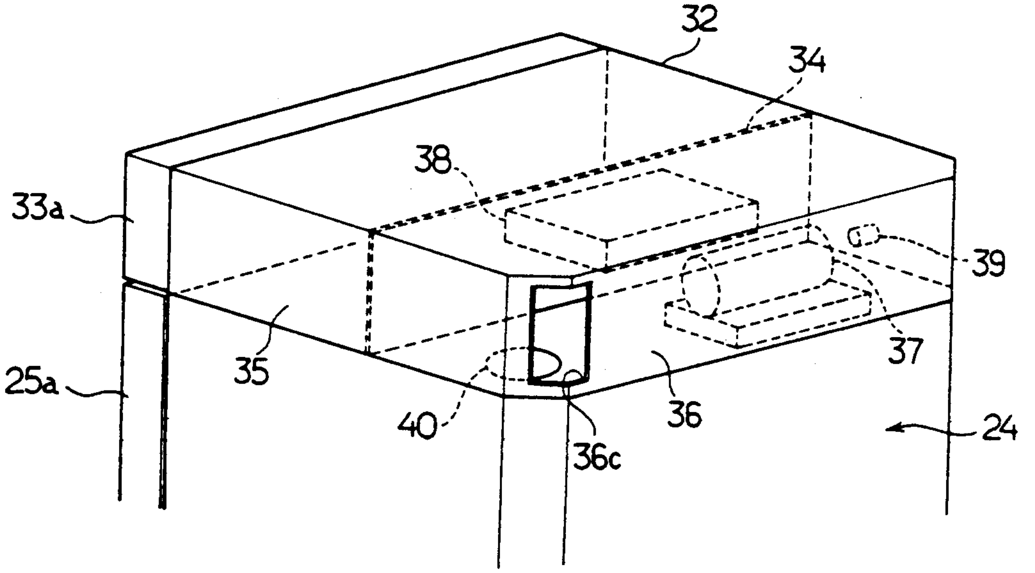

Although ventilating opening 36a is formed in the upper side of the machine compartment 36 in the second embodiment, a slender rectangular ventilating opening 36b may be formed in the vertical wall of the machine compartment 36 so as to extend in the direction intersecting perpendicularly to the direction that the standing wave of the sound in machine compartment 36 travels, or a slender rectangular ventilating opening 36c may be formed in a side corner portion of the machine compartment 36, as shown in FIG. 9.

Although machine compartment space 33 is partitioned by the partition panel 34 such that the electrical parts compartment 35 is disposed in front of the machine compartment 36, in the second embodiment, the machine compartment space 33 may be partitioned by the partition panel 34 such that the electrical parts compartment 35 is positioned at the right-hand or left-hand side of the machine compartment 36.

Figure 10:
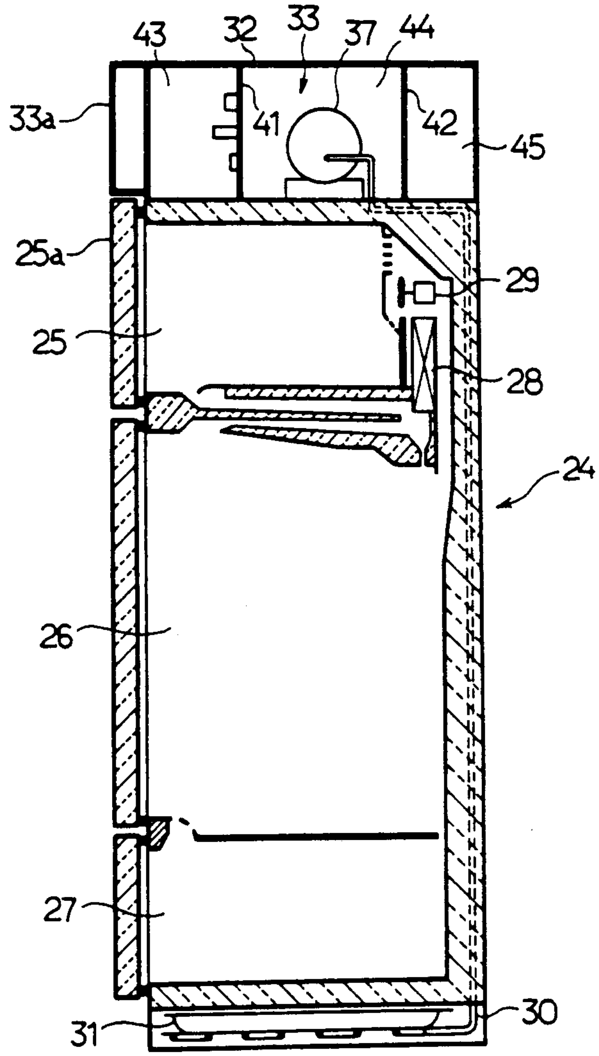
FIG. 10 is a view similar to FIG. 6 showing the refrigerator to which the silencer of a third embodiment is applied.
Figure 11:
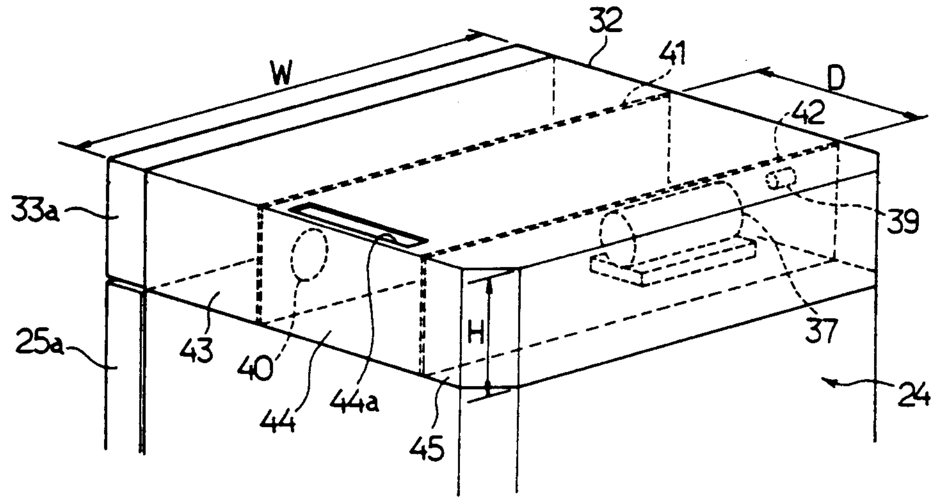
FIG. 11 is a view similar to FIG. 7 illustrating the part of the, refrigerator in FIG. 10 relating to the invention.
Figure 12:
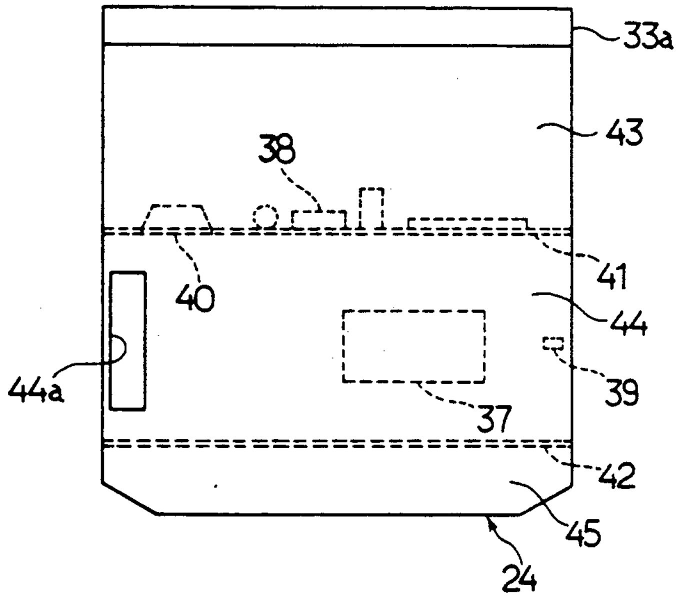
FIG. 12 is a top plan view of the refrigerator in FIG. 10.

FIGS. 10 to 12 illustrate a third embodiment of the invention. Differences between the second and third embodiments will now be described.

In the third embodiment, machine compartment space 33 is air-tightly partitioned by two partition panels 41 and 42 so that a front electrical parts compartment 43, intermediate machine compartment 44 and rear auxiliary compartment 45 are provided. A motor-compressor 37 is provided in the machine compartment 44. A slender rectangular ventilating opening 44a is formed in a portion of the outer casing 32 corresponding to the upper side of the machine compartment 44 so as to extend in the direction intersecting perpendicularly to the direction in which the compartment 44 longitudinally extends, or in the direction intersecting perpendicularly to the direction that the standing wave of the sound in the machine compartment 44 travels. The relationship among the dimensions of depth D, width W and height H of the machine compartment 44 is determined in the same manner as in the second embodiment so that the standing wave of the sound in the machine compartment 44 is composed only in the primary mode in the direction of the width of the machine compartment 44. Each of the partition panels 41 and 42 is formed from the same material as that of outer casing 32, that is, the material having good heat transfer properties and large sound transmission loss. The electrical parts assembly 38 is mounted on the partition panel 41 and disposed in the parts compartment 43. See FIGS. 11 and 12. Microphone 39 is disposed so as to be opposite the compressor 37 from the side opposite the ventilating aperture 36a (the right-hand side, as viewed in FIG. 10). Speaker 40 is mounted on the partition panel 41 with the front side thereof facing the machine compartment 44.

According to the above-described construction, the same effect may be achieved as in the second embodiment. Additionally, the mounting of the speaker 40 may be simplified and affection of unnecessary sound transmitted from the rear side of the speaker 40 may be restrained by the outer casing 32. Further, since the electrical parts assembly 38 is mounted on the partition panel 41, an exclusive member for mounting the electrical parts assembly 38 may not be needed, thereby reducing the number of parts. Since two partition panels 41 and 42 are employed for the formation of the machine compartment 44, the dimensions of the machine compartment 44 may be set with ease. Furthermore, since the machine compartment 44 has partition panels 41, 42 and an outer casing side wall with respect to the direction of its width or the front-to-back direction, the noise transmitting therethrough may be reduced, thereby enhancing the noise reduction effect.

Figure 13:
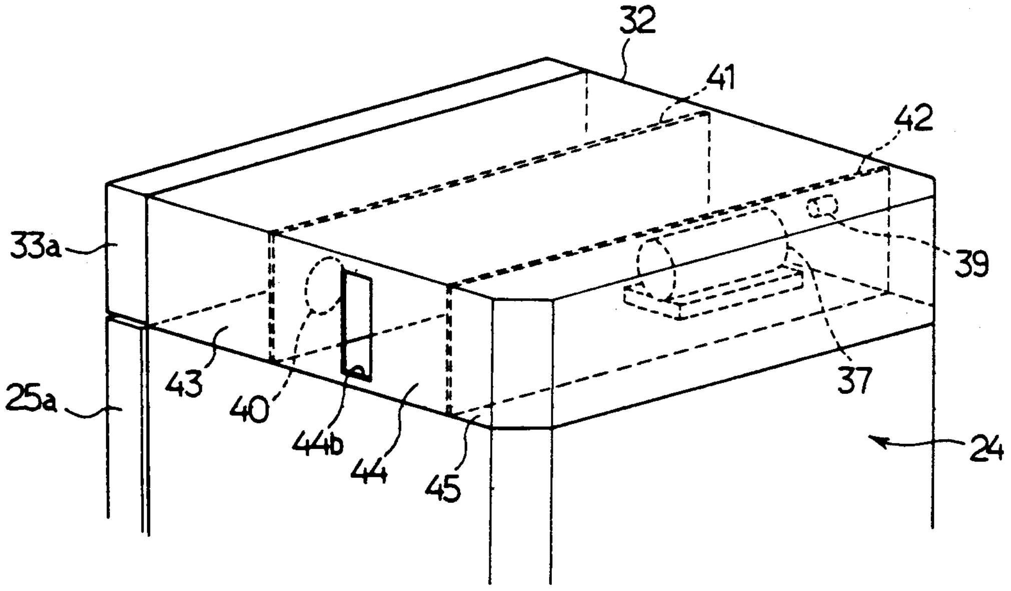
FIGS. 13 and 14 are views similar to FIG. 10 illustrating modified forms of the silencer of the third embodiment.
Figure 14:
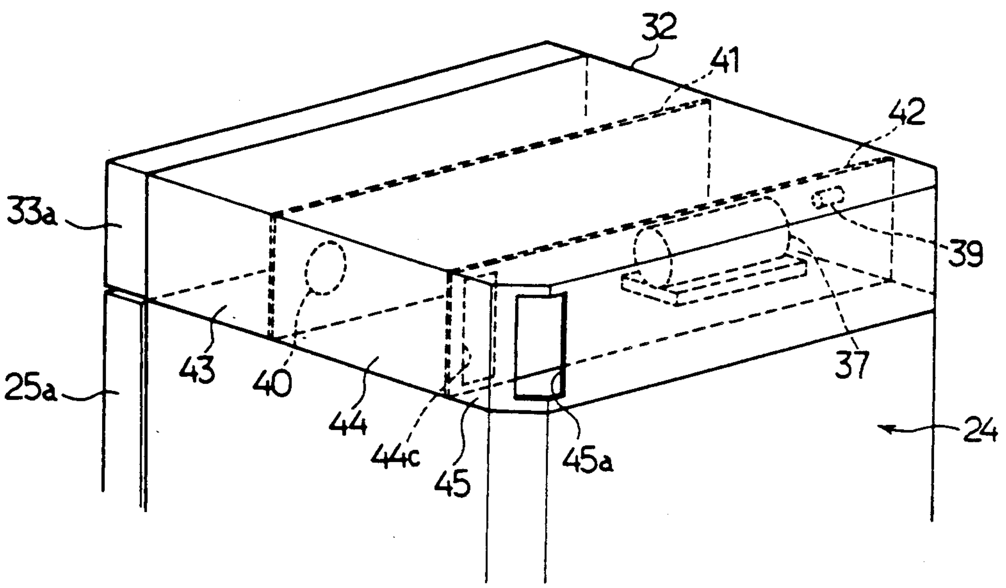

Although the ventilating opening 44a is formed in the upper side of the machine compartment 44 in the third embodiment, a slender rectangular ventilating opening 44b may be formed in a machine compartment peripheral side wall so as to extend vertically, that is, in a direction intersecting perpendicularly to the direction that the standing wave of the sound produced in machine compartment 44 travels, as is shown in FIG. 13. Further, a slender rectangular ventilating opening 44c may be formed in an end portion of the partition panel 42 so as to communicate between the machine compartment 44 and the auxiliary compartment 45, and a slender rectangular ventilating opening 45a may be formed in a side corner portion of the outer casing peripheral wall so as to communicate between the auxiliary compartment 45 and the outside, as shown in FIG. 14.

Although the machine compartment space 33 is partitioned by the partition panels 41, 42 in the transverse direction in the third embodiment, the machine compartment space 33 may be partitioned by two partition panels in the longitudinal direction or obliquely to separate the parts compartment, machine compartment and auxiliary compartment.

Although the silencer of the present invention is applied to a refrigerator in the foregoing embodiments, it may be applied to an outdoor unit of a room air conditioner or a refrigerative display case.

The foregoing disclosure and drawings are merely illustrative of the principles of the present invention and are not to be interpreted in a limiting sense. The only limitation is to be determined from the scope of the appended claims.

What we claim is:

1. A silencer for deadening sound from a sound source comprising:

a sound receiver receiving sound from said sound source to thereby generate an electrical signal in accordance with the received sound;

signal converting means for converting the electrical signal generated by said sound receiver to an electrical signal corresponding to sound interfering with the sound to be received by said sound receiver so that the sound from said sound source is deadened by the effect of sound wave interference;

sound producing means for producing sound in accordance with the electrical signal generated by said signal converting means; and a compartment for enclosing said sound source, said sound receiver and said sound producing means, said compartment being defined by side, bottom, ceiling, front and rear walls so that one of the dimensions of said compartment in the directions of the length, height and width thereof is set at a value larger than a wavelength of the sound to be deadened and the other dimensions thereof are set at respective values smaller than the wavelength of the sound to be deadened such that a standing wave of the sound to be deadened is composed only in said one direction, said compartment having a ventilating opening formed in a predetermined position of at least one of the walls defining the same, said ventilating opening being formed in a generally slender rectangular shape, a direction of a length of the ventilating opening intersecting perpendicularly the direction in which the standing wave of the sound travels in the compartment.

2. A silencer according to claim 1, wherein the sound source includes a motor-compressor comprising a refrigerating cycle means.

3. A silencer according to claim 1, wherein each of the walls defining the compartment is formed of a hard material having metal-like properties of heat transmission and noise reduction.

4. A silencer according to claim 1, wherein the ventilating opening is positioned at one end side of one of the compartment walls extending longitudinally.

5. A silencer according to claim 4, wherein the ventilating opening is partitioned into a plurality of portions in the direction intersecting the direction in which the standing wave of the sound travels in the compartment.

6. A silencer according to claim 4, wherein the sound producing means is disposed at the side of the ventilating opening and the sound receiver is disposed at the side opposite the ventilating opening side with respect to the direction in which the compartment extends longitudinally.

7. A refrigerator comprising:

a heat-insulative cabinet having a storage compartment therein and an evaporator provided therein so as to comprise a refrigerating cycle means;

an outer casing provided on the top of the heat-insulative cabinet so as to define a cavity therein, said outer casing enclosing a motor-compressor comprising the refrigerating cycle means;

a silencer for deadening sound generated by the motor-compressor, comprising a compartment defined by a partition wall in the cavity so as to have side, upper, bottom, front and rear walls, a sound receiver disposed with the motor-compressor in the compartment so as to receive sound generated by the motor-compressor to thereby generate an electrical signal in accordance with the received sound, signal converting means to convert the electrical signal generated by the sound receiver to an electrical signal to produce a sound to interfere with the sound received by the sound receiver, sound producing means provided in the compartment producing sound for deadening the sound from the motor-compressor by the effect of sound wave interference, and one of the dimensions of the compartment in the directions of the length, height and width thereof being set at a value larger than those of the others such that a standing wave of the sound to be deadened is composed only in said one direction.

8. A refrigerator according to claim 7, wherein the dimensions of the compartment in said other directions are shorter than the wavelength of the sound to be deadened.

9. A refrigerator according to claim 7, wherein the compartment has a ventilating opening formed in at least one of the walls defining the compartment and wherein the ventilating opening is formed into a generally slender rectangular shape so as to longitudinally intersect the direction in which the standing wave of the sound travels in the compartment.

10. A refrigerator according to claim 9, wherein the ventilating opening is positioned at one end side of one of the compartment walls extending longitudinally.

11. A refrigerator according to claim 10, wherein the ventilating opening is formed in the upper wall of the compartment.

12. A refrigerator according to claim 10, wherein the ventilating opening is formed in one of the side walls of the compartment.

13. A refrigerator according to claim 10, wherein the ventilating opening is formed in a corner portion of one of the side walls of the compartment.

14. A refrigerator according to claim 7, wherein the sound producing means is disposed on the partition wall.

15. A refrigerator according to claim 7, wherein the compartment is formed by two opposed partition walls or more so as to be away from front and rear walls or side walls of the outer casing.

16. A refrigerator according to claim 15, wherein the dimensions of the compartment in said other directions are shorter than the wavelength of the sound to be deadened.

17. A refrigerator according to claim 15, wherein the compartment has a ventilating opening formed in at least one of the walls defining the compartment and wherein the ventilating opening is formed into a generally slenderly rectangular shape so as to longitudinally intersect the direction in which the standing wave of the sound travels in the compartment.

18. A refrigerator according to claim 17, wherein the ventilating opening is positioned at one end side of one of the compartment walls extending longitudinally.

19. A refrigerator according to claim 18, the ventilating opening is formed in the upper wall of the compartment.

20. A refrigerator according to claim 18, wherein the ventilating opening is formed in one of the side walls of the compartment.

21. A refrigerator according to claim 18, wherein the ventilating opening is formed in a corner portion of one of the side walls of the compartment and which further comprises another ventilating opening formed in one of the partition walls, disposed so as to correspond to the corner portion of the side wall in which said ventilating opening is formed.

22. A refrigerator according to claim 18, which further comprises an electrical parts assembly provided on the partition wall, said electrical parts assembly including the sound producing means and signal converting means.

* * * * *